(12) United States Patent
Hsu et al.

(10) Patent No.: US 6,611,033 B2
(45) Date of Patent: Aug. 26, 2003

(54) MICROMACHINED ELECTROMECHANICAL (MEM) RANDOM ACCESS MEMORY ARRAY AND METHOD OF MAKING SAME

(75) Inventors: Louis L. Hsu, Fishkill, NY (US); Li-Kong Wang, Montvale, NJ (US)

(73) Assignee: IBM Corporation, Armonk, NY (US)

(*) Notice: Subject to any disclaimer, the term of this patent is extended or adjusted under 35 U.S.C. 154(b) by 0 days.

(21) Appl. No.: 09/833,547

(22) Filed: Apr. 12, 2001

(65) Prior Publication Data

US 2002/0151132 A1 Oct. 17, 2002

(51) Int. Cl.[7] .................. H01L 27/14; H01L 29/82; H01L 29/84
(52) U.S. Cl. ......................... 257/414; 257/421
(58) Field of Search .................. 257/414, 421

(56) References Cited

U.S. PATENT DOCUMENTS

| | | | |
|---|---|---|---|
| 5,963,788 A | | 10/1999 | Barron et al. |
| 6,037,719 A | | 3/2000 | Yap et al. |
| 6,100,109 A | * | 8/2000 | Melzner et al. |

* cited by examiner

*Primary Examiner*—Stephen D. Meier
(74) *Attorney, Agent, or Firm*—Dilworth & Barrese, LLP

(57) ABSTRACT

A micromachined electromechanical random access memory (MEMRAM) array is disclosed which includes a plurality of MEM memory cells, where each MEM memory cell has an MEM switch and a capacitor. The MEM switch includes a contact portion configured for moving from a first position to a second position for reading out a charge stored within the capacitor or for writing the charge to the capacitor. A method is also disclosed for fabricating each MEM memory cell of the MEMRAM array.

22 Claims, 5 Drawing Sheets

MICROMACHINED ELECTROMECHANICAL (MEM) RANDOM ACCESS MEMORY ARRAY AND METHOD OF MAKING SAME

FIELD OF THE INVENTION

This invention relates to the field of integrated circuit (IC) design. Specifically, it relates to a random access memory array having a plurality of micromachined electromechanical (MEM) memory cells, where each MEM memory cell includes an MEM switch and a capacitor. This invention also relates to a method of making the MEM random access memory (MEMRAM) array.

BACKGROUND OF THE INVENTION

Micromachined electromechanical (MEM) switches have been developed for light-emitting display applications. U.S. Pat. No. 6,037,719 issued on Mar. 14, 2000 to Yap et al. describes such MEM switches for controlling a plurality of light-emitting devices. Each MEM switch includes a cantilever beam and a control electrode spaced therefrom to deflect the cantilever beam electrostatically in order to close or open the switch.

FIG. 2 of U.S. Pat. No. 6,037,719 illustrates a matrix circuit element of a matrix-addressed display. For each light-emitting device, two switches 22, 24 and one storage capacitor 38 are required. The two switches 22, 24 comprise the MEM switch. The first switch 22, called the driving switch, is used to control the current to drive the light-emitting device. Therefore, it determines the light emission intensity of the pixel.

The second switch 24, called the gating switch, is used to control the on/off timing of the pixel. The state of the driving switch 22 is maintained by the storage capacitor 38 coupled to the gate of the driving switch 22.

Since each matrix circuit element includes two switches, i.e., the MEM switch, and one storage capacitor, it is provided that a MEM random access memory (ME array can be designed having a plurality of MEM memory cells, where each MEM memory cell has an MEM switch and a capacitor.

It is also provided that a method can be implemented for fabricating each MEM memory cell of the MEMRAM array.

SUMMARY

An aspect of the present invention is to provide a random access memory array having a plurality of micromachined electromechanical (MEM) memory cells, where each MEM memory cell has an MEM switch and a capacitor.

Another aspect of the present invention is to provide a method for fabricating the MEM random access memory (MEMRAM) array.

Accordingly, a MEMRAM array is disclosed which includes a plurality of MEM memory cells, where each MEM memory cell has an MEM switch and a capacitor. The MEM switch includes a contact portion configured for moving from a first position to a second position for reading out a charge stored within the capacitor or for writing the charge to the capacitor. A preferred method is also disclosed for fabricating each MEM memory cell of the MEMRAM array.

DETAILED DESCRIPTION OF THE INVENTION

The present invention provides a random access memory array having a plurality of micromachined electromechanical (MEM) cells, where each MEM memory cell has an MEM switch and a capacitor. The present invention also provides a method for fabricating each MEM memory cell of the MEM random access memory (MEMRAM) array.

The MEMRAM array is possible using MEM switches because compared to the conventional MOS transistor or switch, the capacitor size of the MEM cell can be significantly reduced. The capacitor size of the MEM cell can be reduced because the leakage rate of the storage charge of the MEM switch is much less than the leakage rate of the storage charge through the junction of the conventional MOS switch or transistor. In fact, the charge leakage path from the MEM capacitor through an off-state MEM switch simply does not exist. Further, the parasitic capacitance of the MEM switch can be used to maintain the charges. Accordingly, one can minimize the leakage rate and reduce the size of a memory cell by using the MEM switch.

I. Description of the MEM Cell

Figure 1:
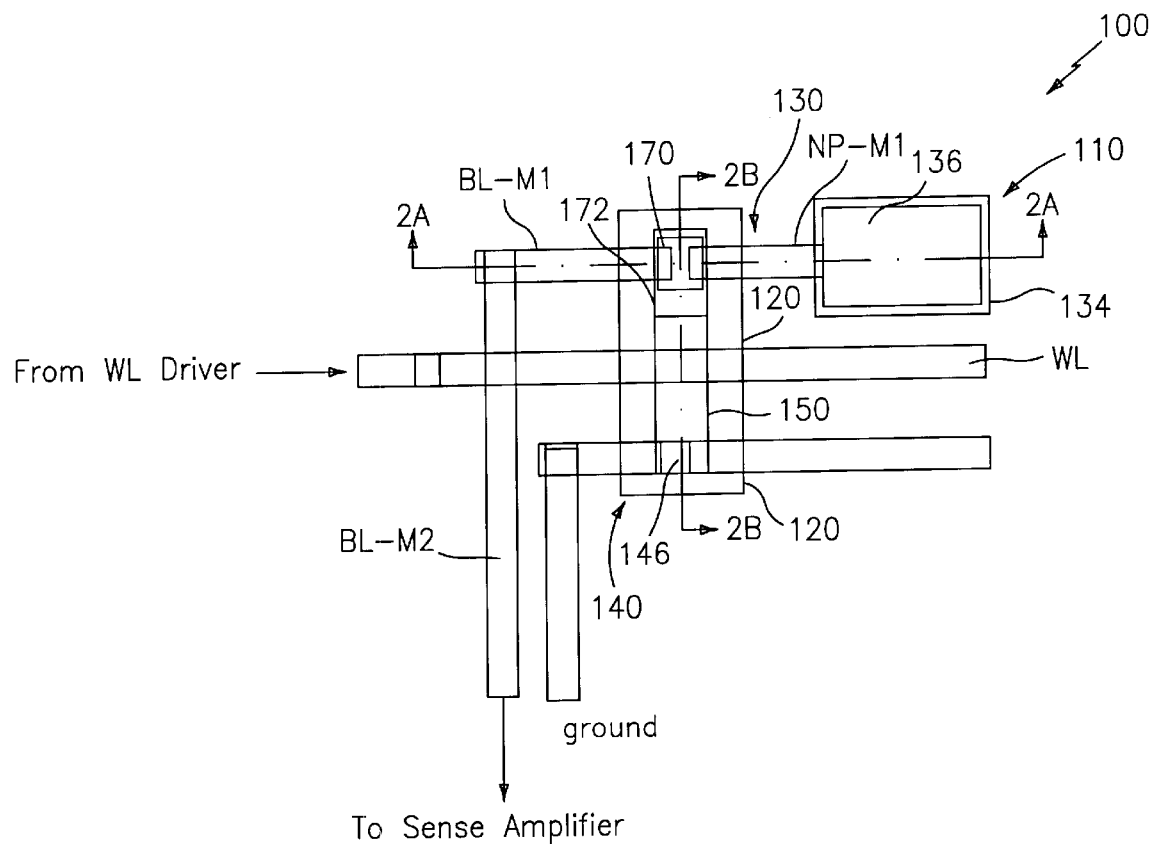
FIG. 1 is a schematic diagram of a micromachined electromechanical (MEW) memory cell according to the present invention.

With reference to FIG. 1, there is shown a schematic diagram of an MEM cell according to the present invention. The MEM cell is designated generally by reference numeral 100 and it includes a capacitor 110 and an MEM switch 120 having a switching element 130 and a fixed end 140 supporting the switching element 130. The MEM switch 120 is tied to ground. The switching element 130 is isolated from the fixed end 140 by an insulating material 150, e.g., a non-conductive beam support.

A wordline WL and a bitline BL traverse the MEM cell 100. The wordline WL is connected to a wordline driver (not shown) and the bitline BL is connected to a sense amplifier (not shown).

The capacitor 110 can be any kind of semiconductor capacitor type, such as planar, trench or stack capacitor. As noted above, the size of the capacitor 110 in an MEM cell can be significantly smaller than that of a capacitor utilized in a conventional DRAM cell. Additionally, if the MEMRAM is built on an SOI substrate, the retention time of each MEMRAM memory cell can be significantly improved.

With continued reference to FIG. 1, during a read operation, when the wordline WL is activated, the corresponding bitline is short to the capacitor 110 and an electrical potential is built up between the wordline WL and the MEM switch 120. When the electrical potential reaches a threshold level, the switching element 130 of the MEM switch 120 is caused to contact a bitline portion BL-M1 due to an electrostatic force. When the switching element 130 is caused to contact the bitline portion BL-M1, the bitline portion BL-M1 is bridged to the capacitor 110 through the MEM switch 120.

When the switching element 130 or cantilever beam of the MEM switch 120 is pulled down, the MEM switch 120 itself does not physically touch the wordline WL or bitline BL. At this time, the charge stored in the capacitor 110 can be read and amplified by a sensing element as known in the art. For example, the sensing element can be any of the conventional single-ended current sensing or direct sensing devices. It can also be a cross-couple differential sense amplifier, etc. It is noted that if a differential sense amplifier is used as the sensing element, a pair of bitlines, one true and one complimentary, are required. After the storage charge is read and sent to a corresponding dataline, a write-back operation is performed to restore the charge in the capacitor 110, as is done for a conventional DRAM memory cell.

A write operation can be performed similarly to the read operation described above. The difference is that the charge now comes from an outside source, for example, from an I/O pad to a daialine passing through a secondary sense amplifier and finally to the capacitor 110 which is addressed by the active wordline WL.

Figure 2A:
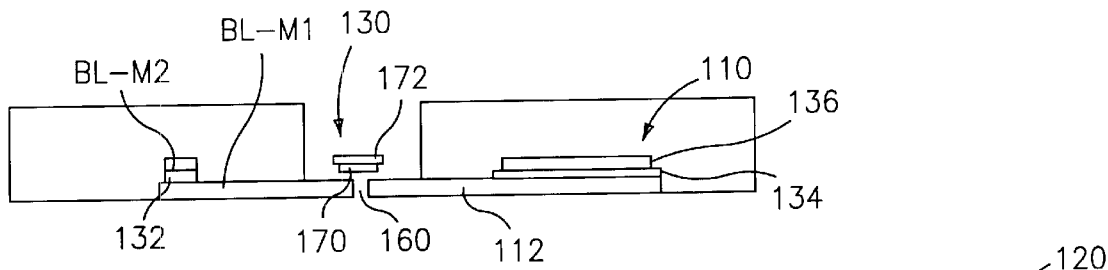
FIG. 2A is a horizontal cross-sectional view taken along line 2A—2A in FIG. 1.
Figure 2B:
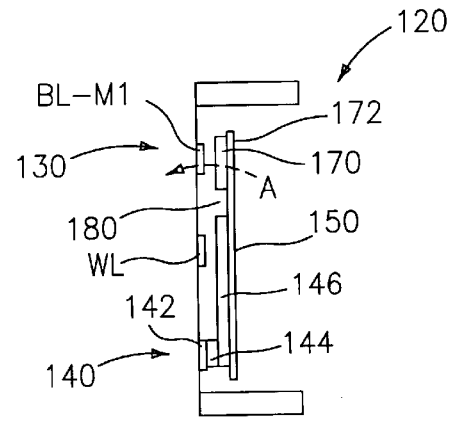
FIG. 2B is a vertical cross-sectional view taken along line 2B—2B in FIG. 1.

Horizontal and vertical cross-sectional views of the MEMRAM memory cell of FIG. 1 are illustrated by FIGS. 2A and 2B, respectively. The horizontal cross-sectional view illustrates a first portion of bitline BLAB formed in M2 (second metal level) traversing in the vertical direction. This first portion of bitline joins via a metal stud 132 the second portion of bitline BL-M1 formed in M1 (first metal level) traversing in the horizontal direction. FIG. 2A also shows a node plate 112 (or bottom electrode) of the capacitor 110 also formed in M1. An insulating (e.g., dielectric) material 134 separates the node plate 112 from a ground plate 136 of the capacitor 110. A gap 160 is presented in between the second portion of bitline BL-M1 and the node plate 112.

The switching element 130 is suspended in the air above the gap 160 between the second portion of bitline BL-M1 and node plate 112. A metallic contact portion 170 of the switching element 130 is formed by a conductive plate (located at the bottom) glued to a non-conductive portion 172 (located at the top).

With reference to FIG. 2B, a cavity area 180 is shown between the switching element 130 and the fixed end 140 of the MEM switch 120. The fixed end 140 has a first fixed end support 142 formed by a first metal, a contact stud 144, and a second fixed end support 146 formed by a second metal. On top of the second fixed end support 146, the non-conductive beam support 150 is provided to hold the two conductive portions 142, 146 of the fixed end 140.

The electrostatic force in the MEM switch 120 is developed due to the potential difference between the second fixed end support 146 of the fixed end 140 and the control electrode (or wordline WL located in the middle). Once the potential reaches the threshold voltage, the contact portion 170 of the switching element 130 is pulled down (as shown by the arc identified by the letter "A" in FIG. 2B) to form a bridge to short the second portion of bitline BL-M1 to the node plate 112 of the capacitor 110.

Figure 3:
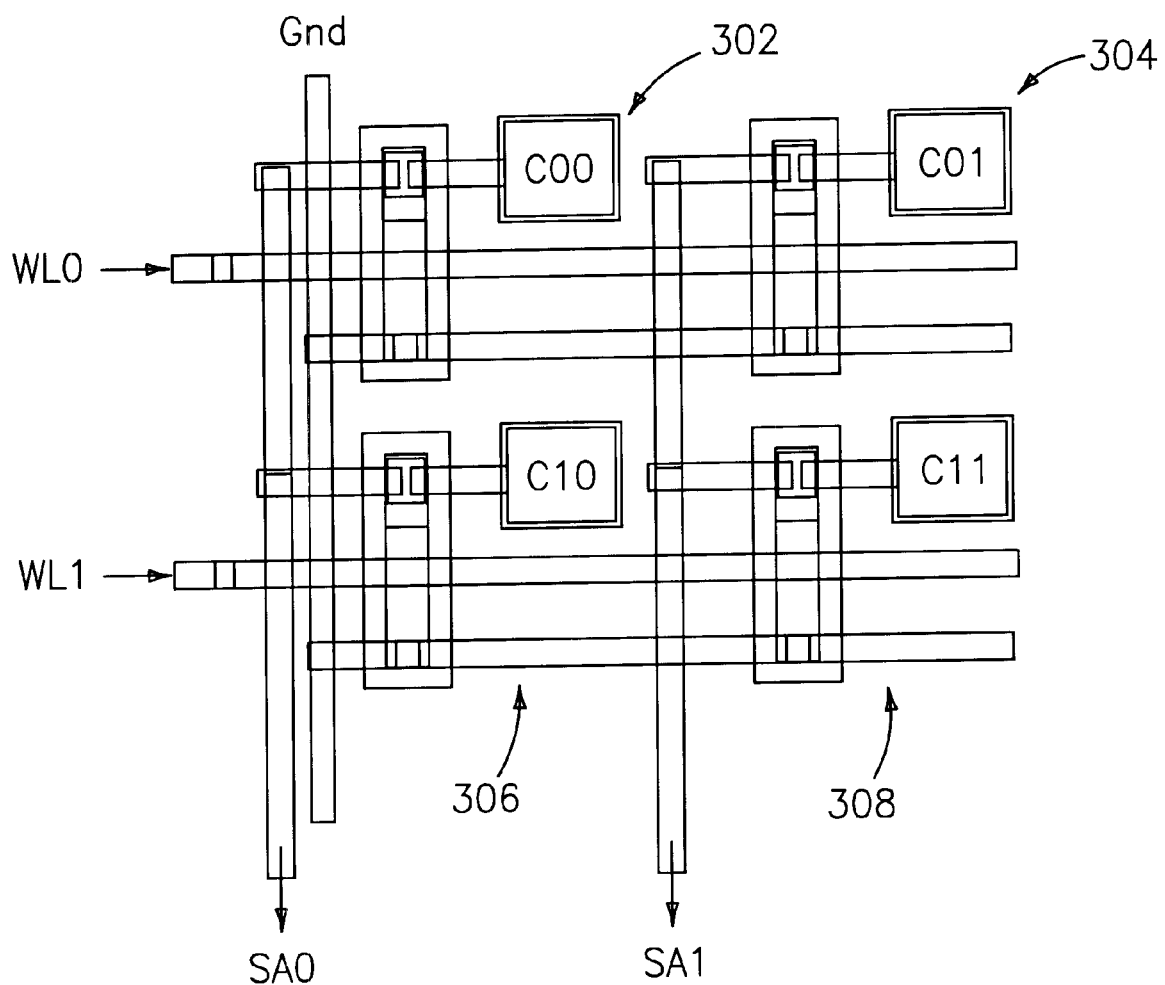
FIG. 3 is a schematic diagram of a 4×4 MEM random access memory (MEMAM) array according to the present invention.

With reference to FIG. 3, there is shown a schematic diagram of a 4×4 MEMRAM array designated generally by reference numeral 300. Compared to the conventional DRAM array, the MEMRAM array design is much simpler, since there is no need for body bias, and thus associated circuits, such as Vbb charge pumps, etc. are not needed. Also, no triple well is necessary which means lower processing cost. In order to avoid dielectric breakdown, the ground node of the capacitors can all be tied to a ½ Vdd level (not shown).

In the arrangement shown by FIG. 3, capacitors C00 and C01 of MEM cells 302 and 304, respectively, can be accessed by wordline WL0, while capacitors C10 and C11 of MEM cells 306 and 308, respectively, can be accessed by wordline WL1. When a wordline is selected and activated by the decoder and driver circuits, the MEM cells of that row will all be read out simultaneously.

II. Methodology for Fabricating an MEM Cell

Figure 4A:
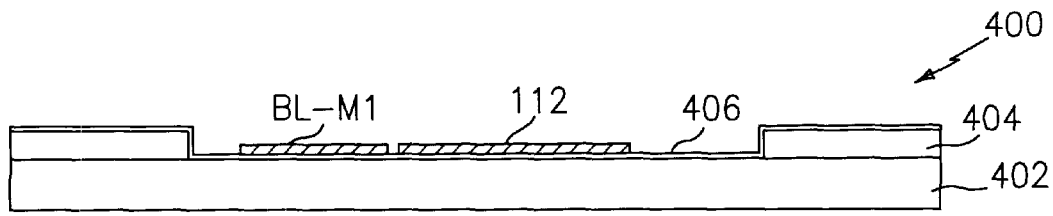
FIGS. 4A–4N are cross-sectional views illustrating a preferred process for fabricating an MEM cell according to the present invention.

A description of a preferred method for fabricating an MEM cell of an MEMRAM array having planar capacitor cells and formed on an SOI substrate will now be provided. The same fabrication method is used for simultaneously fabricating all of the MEM cells of the MEMRAM array. With reference to FIGS. 4A–4N there are shown cross-sectional views for fabricating the MEM cell according to the present invention.

With reference to FIG. 4A, an SOI substrate 400 is used having a buried oxide layer 402 (about 300 nm) and a silicon layer 404 (about 250 nm) for fabricating the MEM cell. It is contemplated that other types of substrates besides semiconductor SOI substrates, such as semiconductor bulk substrates, can be used for fabricating the MEM cell.

With continued reference to FIG. 4A, the MEMRAM array is formed in an area where the silicon layer 404 is etched away. The etched surface is covered by a dielectric material 406, e.g., 20 nm of CVD nitride. A conductive material, such as doped polysiticon, tungsten, gold, platinum, nickel, and palladium, with a thickness of 50 to 100 nm is then deposited and patterned to form the second portion of bitline BL-M1 and the node plate 112 or bottom plate of the capacitor 110.

Figure 4B:
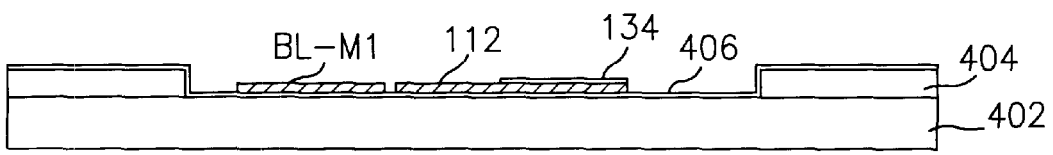

With reference to FIG. 4B, the dielectric material 134 is deposited and patterned. The MEM cell size can be further reduced if a high-dielectric constant material is used. This dielectric material can be $TiO_2$, $Ta_2O_5$, $Al_2O_3$, or even ferroeleciric materials, such as PZT (lead zirconate titanate) having a dielectric constant in the range of 7 to 100.

If the ferroelectric material is used, it is preferable that noble metals, such as platinum or palladium, be used to form the electrode plates. Other ferroelectric materials, such as phase III potassium nitride, and bismuth layered compounds, can all be candidates. One major advantage of using MEM switches is that they are compatible with any high-k material during deposition and annealing. This annealing is typically, however, very detrimental to the conventional MOS transistor devices.

Figure 4C:
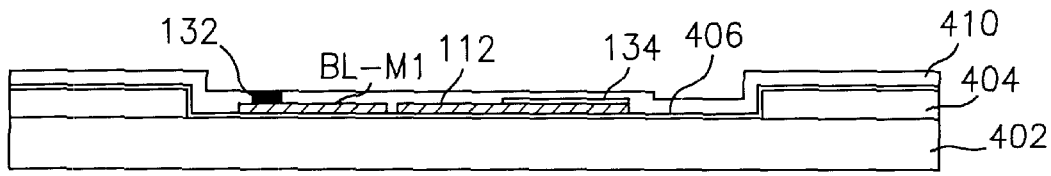

With reference to FIG. 4C, an insulating material 410, e.g., 100 nm CVD oxide, doped glass, etc., is deposited, and the first metal level stud 132 is formed for interconnect. The material for the stud 132 can be tungsten, $TiSi_2$, WSi, TiN, Ti, doped polysilicon, and other suitable materials. A stud similar to stud 132 is also used to form the fixed end 140. The stud 132 must be bound strongly to the first and second metal levels.

Figure 4D:
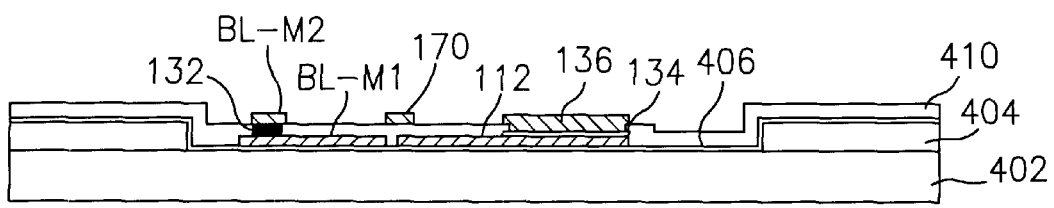

With reference to FIG. 4D, the insulating material 410 is patterned and a conductive material is deposited. The conductive material can be doped polysilicon, tungsten, gold, platinum, nickel, palladium, etc. The ground plate 136 of the capacitor 110, the first portion of bitline BL-M2 and the contact portion 170 of the switching element 130 are then formed by RIE (reactive ion etch) patterning.

Figure 4E:
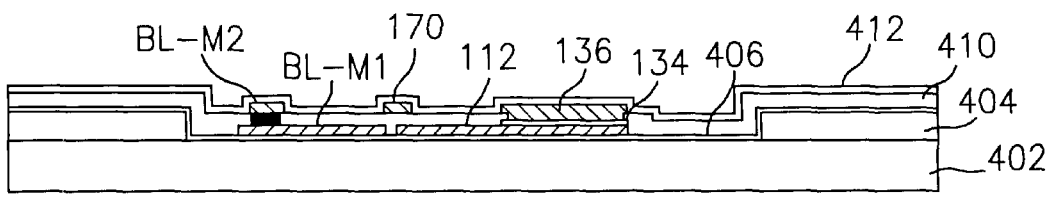
Figure 4F:
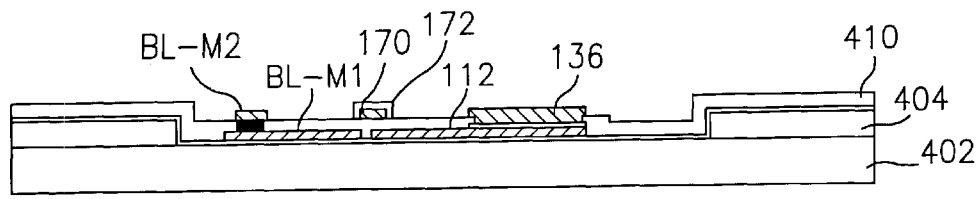

With reference to FIG. 4E, a thin dielectric material 412 (about 10 to 30 mn), such as CVD nitride and aluminum oxide, is then deposited. Another etch is carried out to define the non-conductive portion 172. The dielectric material used to form the non-conductive portion 172 is not etched in buffered HF, and should be flexible and bound well to the metallic contact portion 170. The dielectric material can also be allowed to cover the ground plate 136 of the capacitor 1 to, in order for the ground plate 136 not to be "attacked" during a later BHF etching.

Figure 4G:
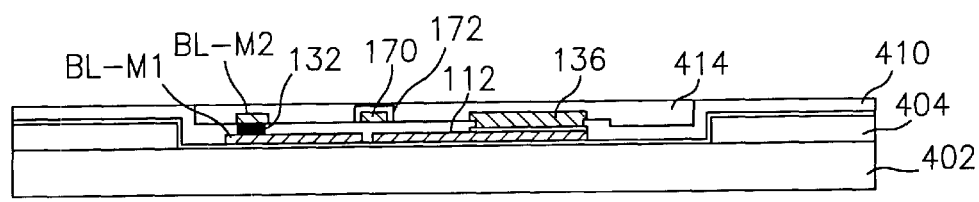

A sacrificial oxide layer 414 about 100 nm is then deposited and planarized as shown in FIG. 4G. The planarization can be carried out by a chem-mech polish step.

Figure 4H:
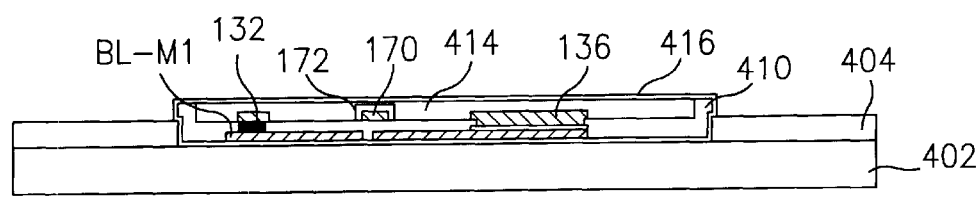

With reference to FIG. 4H, the oxide coating outside the fabrication region is stripped. A nitride layer 416 is deposited to cover the surface of the MEM cell. Small nitride holes are patterned in the nitride layer 416 which covers an MEM switch region 418, so that later a wet etch can be used to remove the underlying sacrificial oxide layer 414 to release the switching element 130 as described below.

MOS devices, such as nMOS and pMOS, are then formed in the support areas, i.e., the areas where the silicon layer 404 is not etched away, using conventional fabrication methods, including field oxidation, gate formation, source/drain diffusion and silicidation, etc.

Figure 4I:
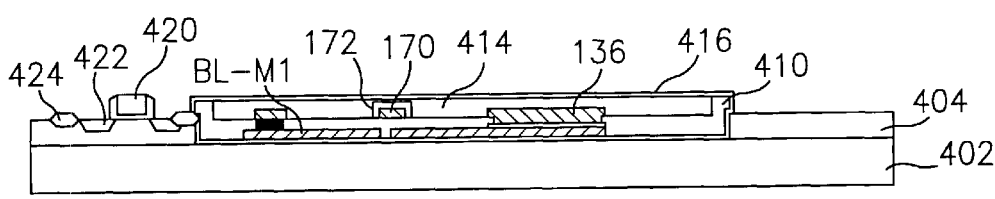

With reference to FIG. 4I, an isolation region 420, ajunction region 422 and the gate 424 of a typical MOS device are shown. The silicide and the ferroelectric materials can then be annealed at the same time in an oxygen ambient at a temperature range from 450 to 700 degrees Celsius for 30 to 90 minutes. The annealing not only enhances the silicide formation in the MOS device junctions 420, 422, but also recovers the damage of the ferroelectric material.

Figure 4J:
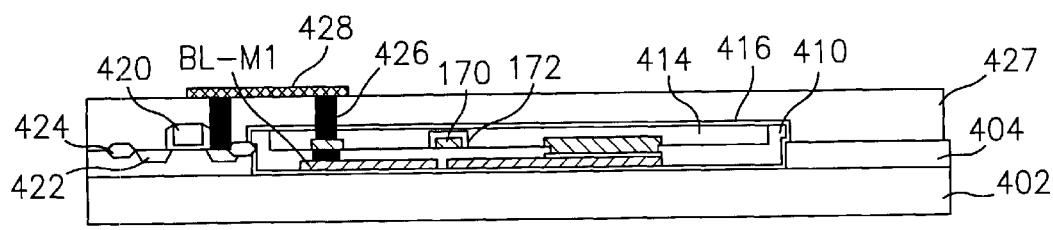
Figure 4K:
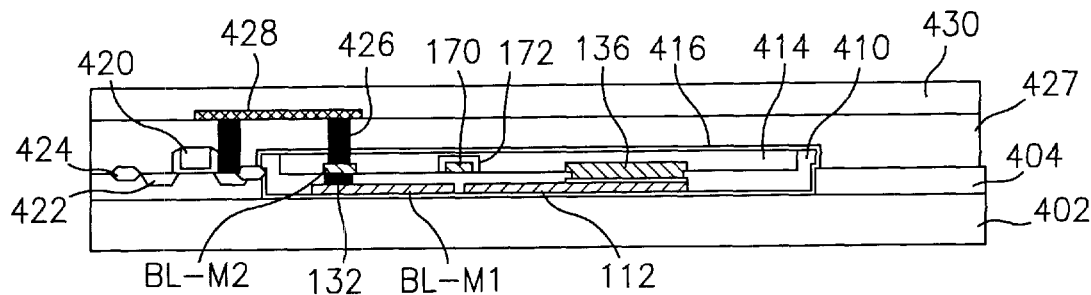

With reference to FIG. 4J, metallic contact studs 426 are connected to the MOS devices and the MEM cell. An insulating material 427 is then deposited to cover the structure. The metallic contact studs 426 are interconnected by metallic stud 428. The metallic contact studs 426, 428 are preferably formed by either aluminum or copper. A final insulating material 430 is then deposited as shown by FIG. 4K to cover the entire structure, including the metallic stud 428, in order to make the MEM memory cell structure planar.

Figure 4L:
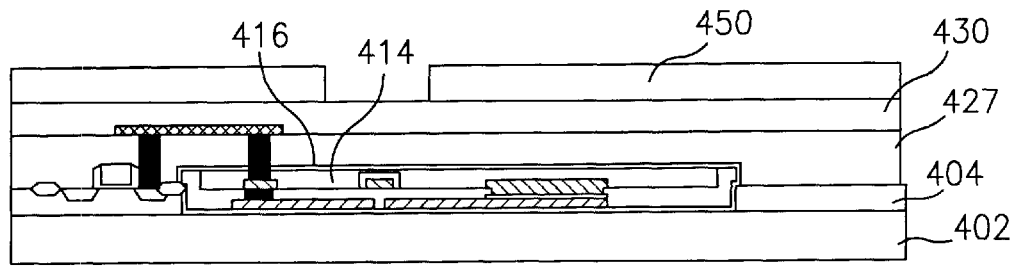
Figure 4M:
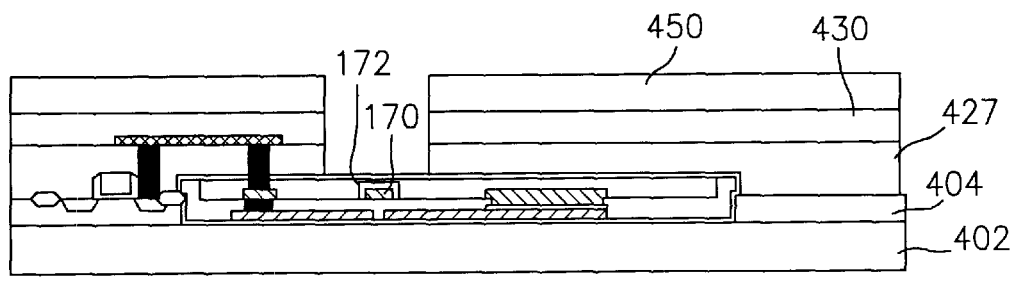
Figure 4N:
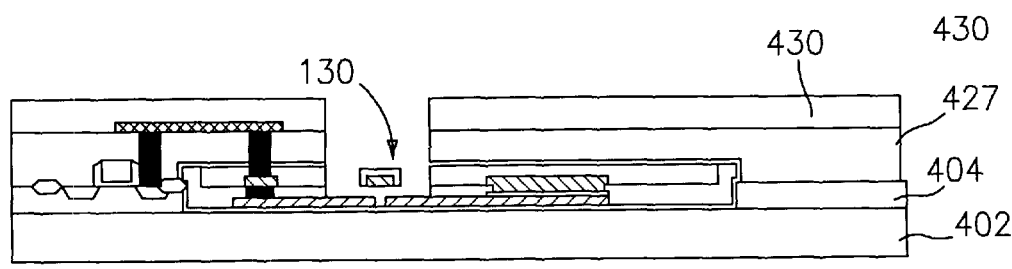

With reference to FIGS. 4L–4N, the process of releasing the switching element 130 of the MEM switch 120 is illustrated. First, a resist layer 450 is deposited and patterned as shown in FIG. 4L. The top two insulating material layers 430, 427 are then removed via a directional RIE process as shown by FIG. 4M. The etching process preferably stops at the nitride layer 416.

A BHF wet etch or down stream isotropic etch is then performed to selectively remove the underlying sacrificial oxide layer 414 oxide layer through the patterned nitride holes in order to release the switching element 130 of the MEM switch 120. The non-conductive glue layer 172 of the switching element 130 is not attacked during the etching process, since it is formed by nitride. FIG. 4N illustrates the option of completely removing the nitride layer 416 and the oxide layer 414.

What has been described herein is merely illustrative of the application of the principles of the present invention. For example, the systems described above and implemented as the best mode for operating the present invention are for illustration purposes only. In other words, other arrangements and methods may be implemented by those skilled in the art without departing from the scope and spirit of this invention.

We claim:

1. A memory system comprising a plurality of micromachined electromechanical memory ("MEM") cells arranged in an array, each of said MEM cells comprising a MEM switch and a capacitor, said MEM switch comprising a switching element and a fixed end for supporting said switching element, said switching element comprising a cantilever beam, said fixed end comprising at least one fixed end support portion and a contact portion, wherein each of the plurality of MEM cells is configured for storing a charge therein.

2. The memory system according to claim 1, wherein the switch includes a contact portion configured for moving from a first position to a second position for reading out the charge stored within the capacitor or for writing the charge to the capacitor.

3. The memory system according to claim 2, wherein the contact portion shorts a bitline to a plate of the capacitor when said contact portion is in the second position.

4. The memory system according to claim 2, wherein the switch includes a fixed end opposite the contact portion.

5. The memory system according to claim 1, wherein a plurality of datalines traverse the array.

6. The memory system according to claim 5, wherein the plurality of datalines include bitlines and wordlines.

7. The memory system according to claim 6, wherein the bitlines and wordlines are embedded within the plurality of MEM memory cells.

8. The memory system according to claim 1, wherein each of the plurality of MEM memory cells is connected to at least one respective MOS device.

9. The memory system according to claim 1, wherein the plurality of MEM memory cells are fabricated on a semiconductor SOI or bulk substrate.

10. The memory system according to claim 1, wherein each of the plurality of MEM memory cells has a planar cell structure.

11. A memory system as in claim 1, wherein a read operation to said MEM cell comprises the following:

activation of a wordline causing a corresponding bitline to short said capacitor, said short causing an electrical potential to build up between said wordline and said MEM switch, said electrical potential reaching a threshold causing said MEM switch to bridge said bitline to said capacitor.

12. A micromachined electromechanical random access memory (MEMRAM) array comprising:

a plurality of micromachined electromechanical memory ("MEM") cells, each of said MEM cells comprising a MEM switch and a capacitor, said MEM switch comprising a switching element and a fixed end for supporting said switching element, said switching element comprising a cantilever beam, said fixed end comprising at least one fixed end support portion and a contact portion, wherein each of the plurality of MEM cells is configured for storing a charge therein.

13. The array according to claim 12, wherein the switch includes a contact portion configured for moving from a first position to a second position for reading out the charge stored within the capacitor or for writing the charge to the capacitor.

14. The array according to claim 13, wherein the contact portion shorts a bitline to a plate of the capacitor when said contact portion is in the second position.

15. The array according to claim 12, wherein the switch includes a fixed end opposite the contact portion.

16. The array according to claim 12, wherein a plurality of datalines traverse the array.

17. The array according to claim 16, wherein the plurality of datalines include bitlines and wordlines.

18. The array according to claim 17, wherein the bitlines and wordlines are embedded within the plurality of MEM memory cells.

19. The array according to claim 12, wherein each of the plurality of MEM memory cells is connected to at least one respective MOS device.

20. The array according to claim 12, wherein the plurality of MEM memory cells are fabricated on a semiconductor SOI or bulk substrate.

21. The array according to claim 12, wherein each of the plurality of MEM memory cells has a planar cell structure.

22. A memory system as in claim 12, wherein a read operation to said MIEM cell comprises the following:

activation of a wordline causing a corresponding bitline to short said capacitor, said short causing an electrical potential to build up between said wordline and said MEM switch, said electrical potential reaching a threshold causing said MEM switch to bridge said bitline to said capacitor.

* * * * *